(12) United States Patent
Liu

(10) Patent No.: US 12,418,308 B2
(45) Date of Patent: Sep. 16, 2025

(54) DATA ENCODING METHOD, DEVICE, AND STORAGE MEDIUM

(71) Applicant: TCL China Star Optoelectronics Technology Co., Ltd., Guangdong (CN)

(72) Inventor: Jinfeng Liu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 231 days.

(21) Appl. No.: 17/294,695

(22) PCT Filed: Mar. 31, 2021

(86) PCT No.: PCT/CN2021/084646
§ 371 (c)(1),
(2) Date: Nov. 29, 2023

(87) PCT Pub. No.: WO2022/193372
PCT Pub. Date: Sep. 22, 2022

(65) Prior Publication Data
US 2024/0088911 A1    Mar. 14, 2024

(30) Foreign Application Priority Data
Mar. 19, 2021    (CN) .......................... 202110294235.6

(51) Int. Cl.
*H03M 7/14*    (2006.01)
(52) U.S. Cl.
CPC .................... *H03M 7/14* (2013.01)
(58) Field of Classification Search
CPC ........... H03M 7/14; H03M 7/30; H03M 7/145
See application file for complete search history.

(56) References Cited

U.S. PATENT DOCUMENTS

| | | | | |
|---|---|---|---|---|
| 5,231,545 A | * | 7/1993 | Gold .................... | H03M 5/145 |
| | | | | 341/59 |
| 5,740,186 A | * | 4/1998 | Widmer ............. | H03M 13/095 |
| | | | | 341/59 |

(Continued)

FOREIGN PATENT DOCUMENTS

| | | |
|---|---|---|
| CN | 108768587 | 11/2018 |
| CN | 108847916 | 11/2018 |

(Continued)

OTHER PUBLICATIONS

International Search Report and the Written Opinion Dated Dec. 22, 2021 From the International Searhcing Authority Re. Application No. PCT/CN2021/084646 and Its Translation Into English. (13 Pages).

(Continued)

*Primary Examiner* — Lam T Mai

(57) ABSTRACT

The present disclosure discloses a data encoding method, a device, and a storage medium. In the present application, by acquiring a first data stream that does not meet a preset standard and recording the first data stream as a data stream to be assigned, performing an arithmetic operation on the first data stream in the data stream to be assigned to generate a second data stream that meets the preset standard, and adding a third preset number of data bits to the data stream that meets the preset standard to obtain the second data stream, the data stream that meets the preset standard can be screened out, and only the data stream that does not meet the preset standard is encoded, which reduces complexity of data calculation and improves efficiency of data transmission.

20 Claims, 2 Drawing Sheets

(56) References Cited

U.S. PATENT DOCUMENTS

| | | | | |
|---|---|---|---|---|
| 5,929,783 | A * | 7/1999 | King | G01S 5/009 |
| | | | | 714/822 |
| 8,004,429 | B2 * | 8/2011 | Oh | H04N 19/136 |
| | | | | 341/51 |
| 8,059,016 | B2 * | 11/2011 | Oh | H03M 7/3088 |
| | | | | 341/51 |
| 8,184,745 | B2 * | 5/2012 | Xie | H04L 27/38 |
| | | | | 375/348 |
| 10,652,625 | B1 * | 5/2020 | Saxton | H04N 21/8547 |
| 2008/0048892 | A1 * | 2/2008 | Carvalho | H04L 25/493 |
| | | | | 341/50 |
| 2011/0022718 | A1 * | 1/2011 | Evans | G06F 3/0686 |
| | | | | 709/231 |
| 2013/0162453 | A1 * | 6/2013 | Jaquette | H03M 7/4062 |
| | | | | 341/67 |
| 2015/0180504 | A1 * | 6/2015 | Kang | H03M 7/30 |
| | | | | 708/203 |
| 2016/0103757 | A1 * | 4/2016 | Liu | G06F 11/3466 |
| | | | | 717/130 |
| 2017/0026054 | A1 * | 1/2017 | Nagata | G06F 17/40 |
| 2020/0050437 | A1 * | 2/2020 | Raman | G06F 11/34 |
| 2024/0056096 | A1 * | 2/2024 | Liu | H03M 7/02 |

FOREIGN PATENT DOCUMENTS

| | | |
|---|---|---|
| CN | 110086575 | 8/2019 |
| CN | 110474709 | 11/2019 |
| CN | 110474710 | 11/2019 |
| CN | 111384959 | 7/2020 |

OTHER PUBLICATIONS

Notification of Office Action and Search Report Dated May 20, 2023 From the State Intellectual Property Office of the People's Republic of China Re. Application No. 202110294235.6 and Its Translation Into English. (18 Pages).

* cited by examiner

DATA ENCODING METHOD, DEVICE, AND STORAGE MEDIUM

The present disclosure claims priority to Chinese patent application filed with the Chinese Patent Office on Mar. 19, 2021 with an application number 202110294235.6 and an invention titled "Data Encoding Method, Device, and Storage Medium", the entire content of which is incorporated into the present disclosure by reference.

FIELD OF INVENTION

The present disclosure relates to computer technology, specifically to a data encoding method, a device, and a storage medium.

BACKGROUND OF INVENTION

In existing thin film transistor liquid crystal display (TFT-LCD) products, when a digital signal is transmitted in a digital channel, it is transmitted from a control (TCON) terminal to a driver terminal. The digital signal to be transmitted needs to be encoded before baseband transmission. Since there is no independent clock signal during data transmission, the clock signal is embedded in data. When there are multiple consecutive 0s or consecutive 1s in the transmitted data, the embedded clock signal is likely to be misidentified at a receiving terminal. The purpose of encoding is to make the transmitted signal have a square wave with a certain jump, so as not to cause too many consecutive 0s or 1s to make clock synchronization information received by the receiving terminal prone to errors and eventually lead to errors.

At present, the most widely used encoding scheme in the field of data transmission is to encode all data packages (i.e., original data), which results in the data taking a lot of time for data encoding and decoding during transmission, which leads to slow data transmission, which affects response time and image quality.

SUMMARY

Technical Problem

The embodiments of the present disclosure provide a data encoding method, a device, and a storage medium, which effectively solves the problem of encoding all data packages at present, so that data needs to spend a lot of time for data encoding and decoding during data transmission, thereby causing slow data transmission, which affects response time and image quality.

Solution to Technical Problem

Technical Solution

According to one aspect of the present disclosure, the present disclosure provides a data encoding method, comprising: obtaining raw data, wherein the raw data comprises a plurality of first data streams; obtaining a first data stream that does not meet a preset standard and recording the first data stream as a data stream to be assigned a value, wherein the first data stream comprises a first preset number of data bits, each of the data bits is filled with a corresponding value, and the preset standard is that a number of consecutive data bits with a same value does not exceed a second preset number; and performing an arithmetic operation on the first data stream in the data stream to be assigned the value to generate a second data stream that meets the preset standard. Wherein the first data stream comprises a zeroth data bit in the first data steam, a first data bit in the first data stream, a second data bit in the first data stream, a third data bit in the first data stream, a fourth data bit in the first data stream, a fifth data bit in the first data stream, a sixth data bit in the first data stream, and a seventh data bit in the first data stream, and wherein the second data stream comprises a zeroth data bit in the second data stream, a first data bit in the second data stream, a second data bit in the second data stream, a third data bit in the second data stream, a fourth data bit in the second data stream, a fifth data bit in the second data stream, a sixth data bit in the second data stream, a seventh data bit in the second data stream, and an eighth data bit in the second data stream.

In addition, the arithmetic operation comprises: assigning a value of the third data bit in the first data stream to the zeroth data bit in the second data stream; assigning a value of the fifth data bit in the first data stream to the third data bit in the second data stream; assigning a value of the sixth data bit in the first data stream to the fourth data bit in the second data stream; assigning a value of the fourth data bit in the first data stream to the seventh data bit in the second data stream; and assigning a value of the seventh data bit in the first data stream to the eighth data bit in the second data stream.

In addition, when the second data bit in the first data stream is a first value and the first data bit in the first data stream is a second value, the first data bit in the second data stream is the second value; when the third data bit in the first data stream is the first value, the second data bit in the first data stream is the second value, and the first data bit in the first data stream is the second value, the first data bit in the second data stream is the second value; when the second data bit in the first data stream is the first value and a zeroth data bit in the first data stream is the first value, the first data bit in the second data stream is the second value; when the second data bit in the first data stream is the second value and the first data bit in the first data stream is the second value, the second data bit in the second data stream is the second value; when the third data bit in the first data stream is the first value, the second data bit in the first data stream is the second value, and the first data bit in the first data stream is the second value, the second data bit in the second data stream is the second value; and when the first data bit in the first data stream is the first value and the zeroth data bit in the first data stream is the second value, the second data bit in the second data stream is the second value.

In addition, when the fourth data bit in the first data stream is the first value, the second data bit in the first data stream is the first value, and the first data bit in the first data steam is the first value, the fifth data bit in the second data stream is the second value; when the second data bit in the first data stream is the second value and the zeroth data bit in the first data stream is the first value, the fifth data bit in the second data stream is the second value; when the first data bit in the first data stream is the second value and the zeroth data bit in the first data stream is the first value, the fifth data bit in the second data stream is the second value; when the fourth data bit in the first data stream is the first value, the second data bit in the first data stream is the first value, and the first data bit in the first data steam is the first value, the sixth data bit in the second data stream is the second value; when the second data bit in the first data stream is the second value and the zeroth data bit in the first data stream is the second value, the sixth data bit in the second data stream is the second value; and when the first data bit in the first data stream is the second value and the zeroth data bit in the first data stream is the second value, the sixth data bit in the second data stream is the second value.

In addition, the data encoding method comprises steps of: obtaining the first data stream that meets the preset standard and recording the first data steam as a data stream to be filled; and adding a third preset number of data bits to the data stream to be filled to obtain the second data stream.

In addition, a value of the first preset number is greater than a value of the second preset number.

In addition, a number of data bits in the second data stream is greater than a number of data bits in the first data stream.

In addition, a value of the second preset number is not greater than 5.

According another aspect of the present disclosure, the present disclosure provides a data encoding device, comprising: a data acquisition unit configured to obtain raw data, wherein the raw data comprises a plurality of first data streams; an assignment data acquisition unit configured to obtain a first data stream that does not meet a preset standard and recording the first stream as a data stream to be assigned, wherein the first data stream comprises a first preset number of data bits, each of the data bits is filled with a corresponding value, and the preset standard is that a number of consecutive data bits with a same value does not exceed a second preset number; and a data assignment unit configured to perform an arithmetic operation on the first data stream in the data stream to be assigned to generate a second data stream that meets the preset standard.

In addition, a value of the first preset number is greater than a value of the second preset number.

In addition, a number of data bits in the second data stream is greater than a number of data bits in the first data stream.

In addition, a value of the second preset number is not greater than 5.

According to yet another aspect of the present disclosure, the present disclosure provides a storage medium, wherein a plurality of instructions are stored in the storage medium, and the instructions are adapted to be loaded by a processor to execute an encoding method, and the encoding method comprises: obtaining raw data, wherein the raw data comprises a plurality of first data streams; obtaining a first data stream that does not meet a preset standard and recording the first data stream as a data stream to be assigned, wherein the first data stream comprises a first preset number of data bits, each of the data bits is filled with a corresponding value, and the preset standard is that a number of consecutive data bits with a same value does not exceed a second preset number; and performing an arithmetic operation on the first data stream in the data stream to be assigned to generate a second data stream that meets the preset standard. Wherein the first data stream comprises a zeroth data bit in the first data steam, a first data bit in the first data stream, a second data bit in the first data stream, a third data bit in the first data stream, a fourth data bit in the first data stream, a fifth data bit in the first data stream, a sixth data bit in the first data stream, and a seventh data bit in the first data stream, and wherein the second data stream comprises a zeroth data bit in the second data stream, a first data bit in the second data stream, a second data bit in the second data stream, a third data bit in the second data stream, a fourth data bit in the second data stream, a fifth data bit in the second data stream, a sixth data bit in the second data stream, a seventh data bit in the second data stream, and an eighth data bit in the second data stream.

In addition, the arithmetic operation comprises: assigning a value of the third data bit in the first data stream to the zeroth data bit in the second data stream; assigning a value of the fifth data bit in the first data stream to the third data bit in the second data stream; assigning a value of the sixth data bit in the first data stream to the fourth data bit in the second data stream; assigning a value of the fourth data bit in the first data stream to the seventh data bit in the second data stream; and assigning a value of the seventh data bit in the first data stream to the eighth data bit in the second data stream.

In addition, the arithmetic operation further comprises: when the second data bit in the first data stream is a first value and the first data bit in the first data stream is a second value, the first data bit in the second data stream is the second value; when the third data bit in the first data stream is the first value, the second data bit in the first data stream is the second value, and the first data bit in the first data stream is the second value, the first data bit in the second data stream is the second value; when the second data bit in the first data stream is the first value and a zeroth data bit in the first data stream is the first value, the first data bit in the second data stream is the second value; when the second data bit in the first data stream is the second value and the first data bit in the first data stream is the second value, the second data bit in the second data stream is the second value; when the third data bit in the first data stream is the first value, the second data bit in the first data stream is the second value, and the first data bit in the first data stream is the second value, the second data bit in the second data stream is the second value; and when the first data bit in the first data stream is the first value and the zeroth data bit in the first data stream is the second value, the second data bit in the second data stream is the second value.

In addition, the arithmetic operation further comprises: when the fourth data bit in the first data stream is the first value, the second data bit in the first data stream is the first value, and the first data bit in the first data steam is the first value, a fifth data bit in the second data stream is the second value; when the second data bit in the first data stream is the second value and the zeroth data bit in the first data stream is the first value, the fifth data bit in the second data stream is the second value; when the first data bit in the first data stream is the second value and the zeroth data bit in the first data stream is the first value, the fifth data bit in the second data stream is the second value; when the fourth data bit in the first data stream is the first value, the second data bit in the first data stream is the first value, and the first data bit in the first data steam is the first value, a secondsixth data bit in the second data stream is the second value; when the second data bit in the first data stream is the second value and the zeroth data bit in the first data stream is the second value, the sixth data bit in the second data stream is the second value; and when the first data bit in the first data stream is the second value and the zeroth data bit in the first data stream is the second value, the sixth data bit in the second data stream is the second value.

In addition, the data encoding method comprises steps of: obtaining the first data stream that meets the preset standard and recording the first data steam as a data stream to be filled; and adding a third preset number of data bits to the data stream to be filled to obtain the second data stream.

In addition, a value of the first preset number is greater than a value of the second preset number.

In addition, a number of data bits in the second data stream is greater than a number of data bits in the first data stream.

In addition, a value of the second preset number is not greater than 5.

Advantages of Invention

Beneficial Effect

The advantage of the present disclosure is that by acquiring the first data stream that does not meet the preset standard and recording the first data stream as the data stream to be assigned, performing an arithmetic operation on the first data stream in the data stream to be assigned to generate the second data stream meeting the preset standard, and adding a third preset number of data bits to the data stream that meets the preset standard to obtain the second data stream, the data stream that meets the preset standard can be screened out, and only the data stream that does not meet the preset standard is encoded, which reduces complexity of data calculation and improves efficiency of data transmission.

BRIEF DESCRIPTION OF DRAWINGS

Description of Drawings

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

Figure 1:
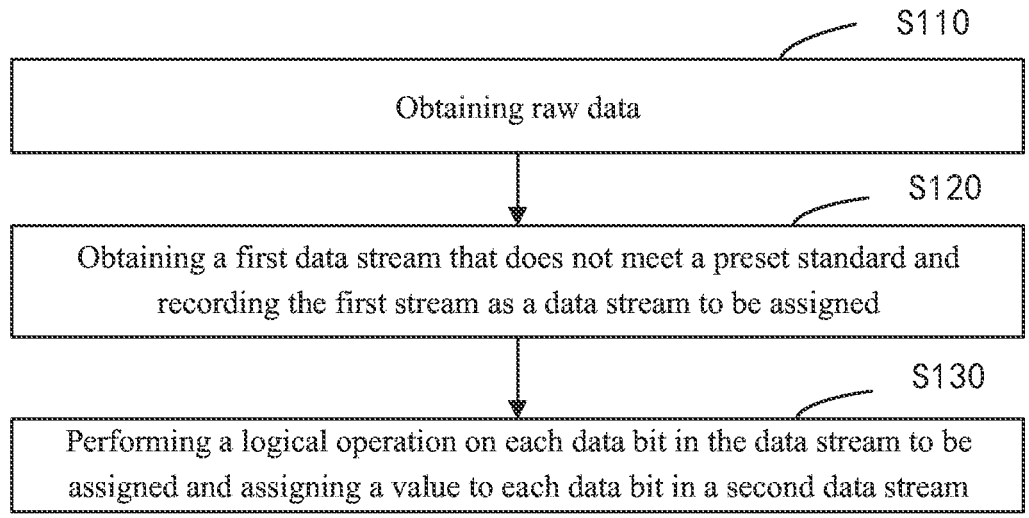

FIG. 1 is a flowchart of steps of a data encoding method provided by a first embodiment of the present disclosure.

Figure 2:
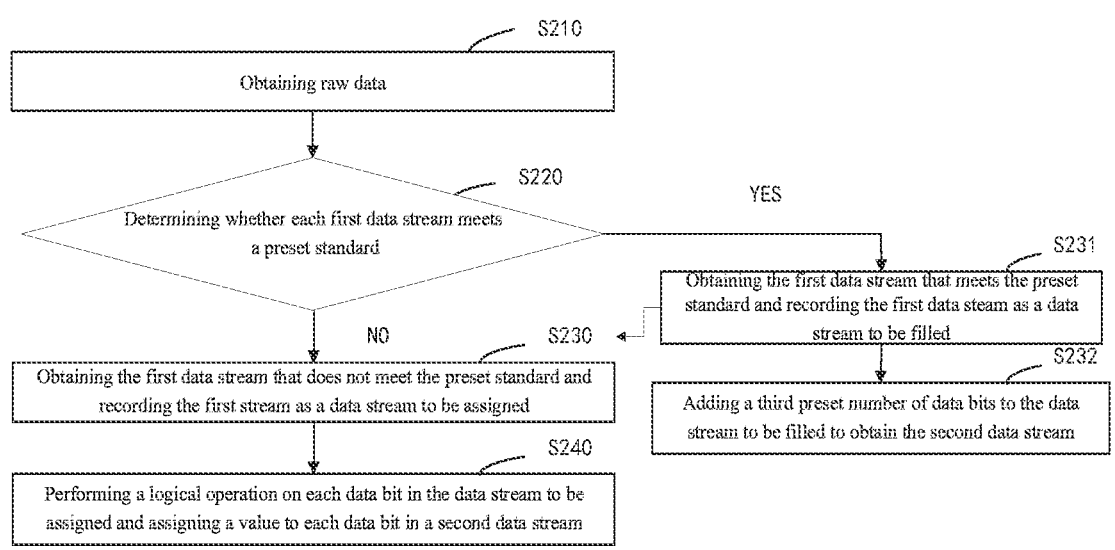

FIG. 2 is a flowchart of steps of a data encoding method provided by a second embodiment of the present disclosure.

Figure 3:
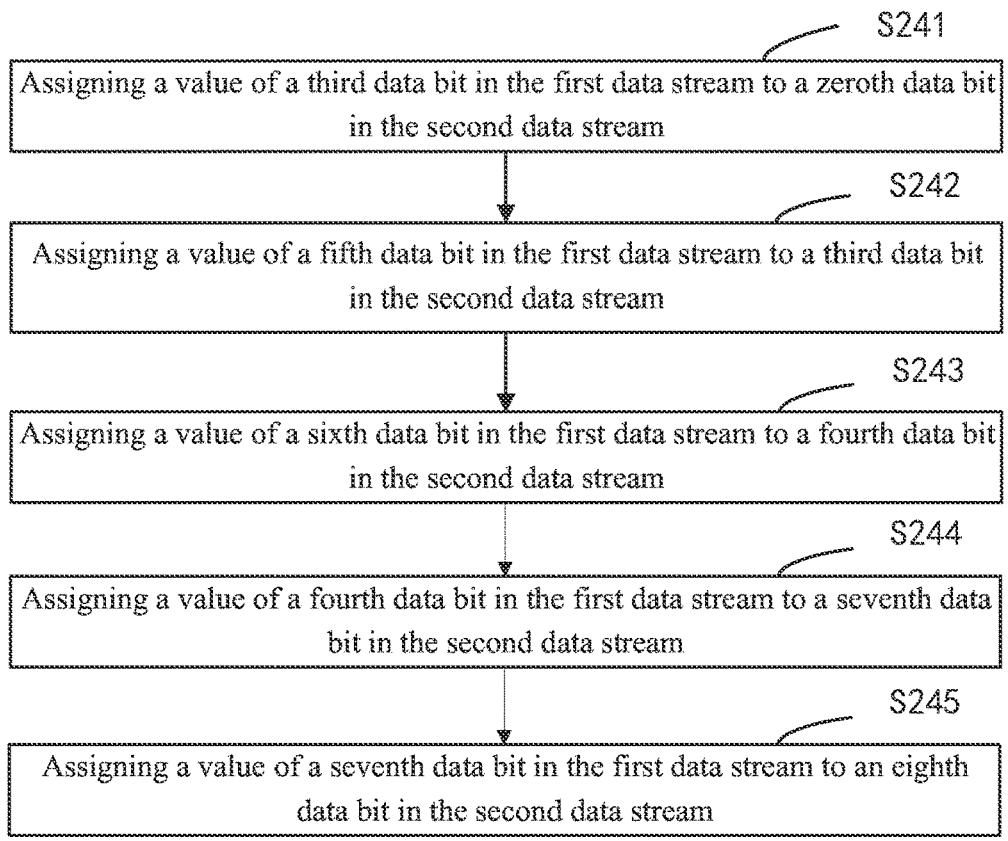

FIG. 3 is a flowchart of an embodiment of sub-steps of step S240 shown in FIG. 2.

Figure 4:
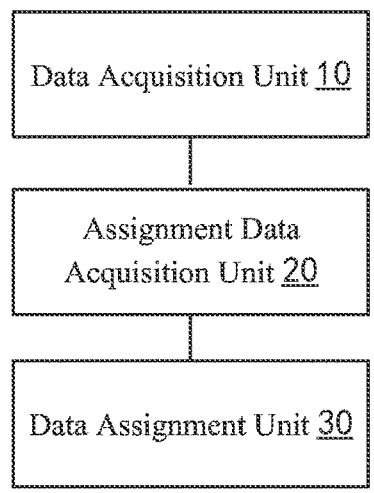

FIG. 4 is a schematic structural diagram of a data encoding device provided by a third embodiment of the present disclosure.

Figure 5:
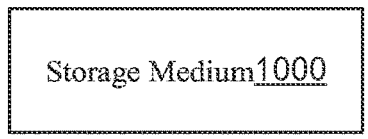

FIG. 5 is an internal structural diagram of a computer device provided by a fourth embodiment of the present disclosure.

DETAILED DESCRIPTION OF EMBODIMENTS

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

As shown in FIG. 1, FIG. 1 is a flowchart of steps of a data encoding method provided in a first embodiment of the present disclosure. The method comprises steps:

Step S110: obtaining raw data.

Specifically, the raw data comprises a plurality of data streams. The data streams are arranged in sequence, and during an encoding process, the data streams are encoded in sequence. When the data is transmitted, the data streams are transmitted in sequence according to a sequence of data stream encoding.

Step S120: obtaining a first data stream that does not meet a preset standard and recording the first data stream as a data stream to be assigned a value.

The data stream comprises a first preset number of data bits, and each of the data bits is filled with a corresponding value, and the preset standard is that a number of consecutive data bits with a same value does not exceed a second preset number. In this embodiment, a value of the first preset number is greater than a value of the second preset number, and the first preset number is 8, so the first data stream is 8-bit data. Each data bit is filled with a corresponding value. For example, the first data stream recorded is a square wave signal, and the data bits of the first data stream are filled with corresponding values, which are either 0 or 1.

The following will describe in detail a calculation method of the preset standard. Assuming that the first data stream is an 8-bit data (i.e., data bits of M0 to M7), and the second preset number is 5, detailed logic operation of the preset standard is as follows: NAND(NAND(M7-M2), NAND (M6-M1), NAND(M5-M0), OR(M7-M2), OR(M6-M1), OR(M5-M0))==1. Wherein (M7-M2) means M7, M6, M5, M4, M3 and M2, other refers to (M7-M2), NAND means a XOR operation, OR means an OR operation, and ==means whether it is equal. It can be seen that NAND(M7-M2), NAND(M6-M1), and NAND(M5-M0) indicate that whether there is 0 in every 6 consecutive values in M7-M0, OR(M7-M2), OR(M6-M1), and OR(M5-M0) indicate whether there is 1 in every 6 consecutive values in M7-M0. That is to say, if there are consecutive same values in the first data stream, for example, an 8-Bit first data stream is (1011 1111), the first data stream is defined as the first data stream that does not meet the preset standard, and the first data stream may be a data signal that will cause bit errors during channel transmission.

Step S130: performing a logical operation on each data bit in the data stream to be assigned and assigning a value to each data bit in a second data stream.

In this embodiment, a number of the data bits in the second data stream is greater than a number of the data bits in the first data stream. The number of the data bits in the second data stream is 9.

The advantage of the present disclosure is that by acquiring the first data stream that does not meet the preset standard and recording the first data stream as the data stream to be assigned, performing an arithmetic operation on the first data stream in the data stream to be assigned to generate the second data stream meeting the preset standard, and adding a third preset number of data bits to the data stream that meets the preset standard to obtain the second data stream, the data stream that meets the preset standard can be screened out, and only the data stream that does not meet the preset standard is encoded, which reduces complexity of data calculation and improves efficiency of data transmission.

As shown in FIG. 2, FIG. 2 is a flowchart of steps of a data encoding method provided in a second embodiment of the present disclosure. The method comprises steps:

Step S210: obtaining raw data.

Specifically, the raw data comprises a plurality of data streams. The data streams are arranged in sequence, and during encoding process, the data streams are encoded in sequence. When the data is transmitted, the data streams are transmitted in sequence according to a sequence of data stream encoding.

Step S220: determining whether each first data stream meets a preset standard.

The data stream comprises a first preset number of data bits, and each first data bit is filled with a corresponding value, and the preset standard is that a number of consecutive data bits with a same value does not exceed a second preset number. In this embodiment, a value of the first preset number is greater than a value of the second preset number, and the first preset number is 8, so the first data stream is an 8-Bit data. Each data bit is filled with a corresponding value. For example, the first data stream recorded is a square wave signal, and the data bits of the first data stream are filled with corresponding values, which are either 0 or 1.

The following will describe in detail a calculation method of the preset standard. Assuming that the first data stream is an 8-bit data (i.e., data bits of M0 to M7), and the second preset number is 5, detailed logic operation of the preset standard is as follows: NAND(NAND(M7-M2), NAND (M6-M1), NAND(M5-M0), OR(M7-M2), OR(M6-M1), OR(M5-M0))==1. Wherein (M7-M2) means M7, M6, M5, M4, M3 and M2, others refer to (M7-M2), NAND means an XOR operation, OR means an OR operation, and ==means whether it is equal. It can be seen that NAND(M7-M2), NAND(M6-M1), and NAND(M5-M0) indicate that whether there is 0 in every 6 consecutive values in M7-M0, OR(M7-M2), OR(M6-M1), and OR(M5-M0) indicate whether there is 1 in every 6 consecutive values in M7-M0.

Step S230: obtaining the first data stream that does not meet the preset standard and recording the first stream as a data stream to be assigned.

That is to say, if there are consecutive same values in the first data stream, for example, an 8-Bit first data stream is (1011 1111), the first data stream is defined as the first data stream that does not meet the preset standard, and the first data stream may be a data signal that will cause bit errors during channel transmission.

Step S240: performing a logical operation on each data bit in the data stream to be assigned a value and assigning a value to each data bit in a second data stream.

In this embodiment, a number of the data bits in the second data stream is greater than a number of the data bits in the first data stream. The number of the data bits in the second data stream is 9. When performing logical assignment for the data stream to be assigned, a flag value of the data stream to be assigned should first be obtained, and the flag value is configured to improve discreteness of the data stream, specifically as follows:

Refer to FIG. 3, FIG. 3 is a flowchart of sub-steps of step S240 in FIG. 2.

Step S240 specifically comprises the following steps:

Step S241: assigning a value of a third data bit in the first data stream to a zeroth data bit in the second data stream.

Step S242: assigning a value of a fifth data bit in the first data stream to a third data bit in the second data stream.

Step S243: assigning a value of a sixth data bit in the first data stream to a fourth data bit in the second data stream.

Step S244: assigning a value of a fourth data bit in the first data stream to a seventh data bit in the second data stream.

Step S245: assigning a value of a seventh data bit in the first data stream to an eighth data bit in the second data stream.

When any one of the following conditions is satisfied in the second data stream, a first data bit in the second data stream is a second value, and the first case is when a second data bit in the first data stream is a first value and a first data bit in the first data stream is the second value, the first data bit in the second data stream is the second value; the second case is when the third data bit in the first data stream is the first value, the second data bit in the first data stream is the second value, and the first data bit in the first data stream is the second value, the first data bit in the second data stream is the second value; and the third case is when the second data bit in the first data stream is the first value and a zeroth data bit in the first data stream is the first value, the first data bit in the second data stream is the second value.

When any one of the following conditions is satisfied in the second data stream, a fifth data bit in the second data stream is the second value, and the first case is when the fourth data bit in the first data stream is the first value, the second data bit in the first data stream is the first value, and the first data bit in the first data steam is the first value, the fifth data bit in the second data stream is the second value; the second case is when the second data bit in the first data stream is the second value and the zeroth data bit in the first data stream is the first value, the fifth data bit in the second data stream is the second value; and the third case is when the first data bit in the first data stream is the second value and the zeroth data bit in the first data stream is the first value, the secondfifth data bit in the fifthsecond data stream is the second value.

When any one of the following conditions is satisfied in the second data stream, a sixth data bit in the second data stream is the second value, and the first case is when the fourth data bit in the first data stream is the first value, the second data bit in the first data stream is the first value, and the first data bit in the first data steam is the first value, the sixth data bit in the second data stream is the second value; the second case is when the second data bit in the first data stream is the second value and the zeroth data bit in the first data stream is the second value, the sixth data bit in the second data stream is the second value; and the third case is when the first data bit in the first data stream is the second value and the zeroth data bit in the first data stream is the second value, the sixth data bit in the second data stream is the second value.

When any one of the following conditions is satisfied in the second data stream, a sixth data bit in the second data stream is the second value, and the first case is when the fourth data bit in the first data stream is the first value, the second data bit in the first data stream is the first value, and the first data bit in the first data steam is the first value, the sixth data bit in the second data stream is the second value; the second case is when the second data bit in the first data stream is the second value and the zeroth data bit in the first data stream is the second value, the sixth data bit in the second data stream is the second value; and the third case is when the first data bit in the first data stream is the second value and the zeroth data bit in the first data stream is the second value, the sixth data bit in the second data stream is the second value.

Wherein the first value is 0, and the second value is 1.

The foregoing arithmetic operations are obtained from multiple experiments and tests, which can effectively adjust discreteness of the first data stream. In some other embodiments, the arithmetic operation can also be performed by the following logical operations, for example:

Obtain values of a plurality of data bits in the data stream to be assigned values.

In this embodiment, for example, for an 8-bit data stream (1011 1111), M0 and M1 are selected, i.e., M0=1 and M1=0. There is no limitation on the number of selected data bits.

For the convenience of calculation, two data bits are generally selected. The selected data bits can also be arbitrary. Generally, in order to make the data stream more discrete (i.e., a waveform jump frequency of the data is high), adjacent data bits are selected.

Perform the XOR operation on the values of the plurality of data bits in the data stream to be assigned to obtain the tag value of the data stream to be assigned.

For example, select M0=1 and M1=0. Assuming that the tag value is X, X=NAND (M0, M1).

Perform a logical operation on each data bit in the data stream to be assigned a value according to the tag value and assign it to each data bit in the second data stream.

According to calculation in the step S241 and the step S242, X=0, the logic operation of this embodiment is as follows, since the second data stream is 9-bits (i.e., there are 9 data bits)N0-N8, where N0=~M1, N1=~M1, N2=M1, N3=M2, N4=NAND(~X, M3), N5=NAND(X, M4), N6=~M5, N7=NAND(~X, M6), N8=NAND(X, M7)). Discreteness of the data steam can be increased through the above-mentioned logical operation.

Step S231: obtaining the first data stream that meets the preset standard and recording the first data steam as a data stream to be filled.

In this step, for the detailed calculation method of the preset standard, please refer to the calculation method of step S120, which will not be repeated here.

Step S232: adding a third preset number of data bits to the data stream to be filled to obtain the second data stream.

In this embodiment, the third preset number is 1, but it is not limited to this. According to product requirements, the encoding of the signal can be more bits, for example, 8 bits can be converted into 10 bits and so on. Compared to performing the logical operation on each data bit in the data stream to be assigned a value and assigning it to each data bit in the second data stream, only the third preset number of data bits are added to the data stream to be filled in this step, which has a small amount of calculation, so calculation time of encoding and decoding can be shortened, and the data transmission efficiency can be improved.

In addition, in this embodiment, the third preset number is 1, that is, the conversion of 8 bits to 9 bits saves transmission channels compared to the conversion of 8 bits to 10 bits.

The advantage of the present disclosure is that by acquiring the first data stream that does not meet the preset standard and recording the first data stream as the data stream to be assigned, performing the arithmetic operation on the first data stream in the data stream to be assigned to generate the second data stream meeting the preset standard, and adding a third preset number of data bits to the data stream that meets the preset standard to obtain the second data stream, the data stream that meets the preset standard can be screened out, and only the data stream that does not meet the preset standard is encoded, which reduces complexity of data calculation and improves data transmission efficiency.

As shown in FIG. 4, FIG. 4 is a schematic structural diagram of a data encoding device provided in a third embodiment of the present disclosure. The device comprises: a data acquisition unit 10, an assignment data acquisition unit 20, and a data assignment unit 30.

The data acquisition unit 10 is configured to obtain raw data. Specifically, the raw data comprises a plurality of data streams. The data streams are arranged in sequence, and during encoding process, the data streams are encoded in sequence. When the data is transmitted, the data streams are transmitted in sequence according to a sequence of data stream encoding.

The assignment data acquisition unit 20 is configured to determine whether each first data stream meets a preset standard. Wherein the data stream comprises a first preset number of data bits, and each first data bit is filled with a corresponding value, and the preset standard is that a number of consecutive data bits with a same value does not exceed a second preset number. In this embodiment, a value of the first preset number is greater than a value of the second preset number, and the first preset number is 8, so the first data stream is an 8-bit data. Each data bit is filled with a corresponding value. For example, the first data stream recorded is a square wave signal, and the data bits of the first data stream are filled with corresponding values, which are either 0 or 1.

The following will describe in detail a calculation method of the preset standard. Assuming that the first data stream is an 8-bit data (i.e., data bits of M0 to M7), and the second preset number is 5, detailed logic operation of the preset standard is as follows: NAND(NAND(M7-M2), NAND (M6-M1), NAND(M5-M0), OR(M7-M2), OR(M6-M1), OR(M5-M0))==1. Wherein (M7-M2) means M7, M6, M5, M4, M3 and M2, others refer to (M7-M2), NAND means an XOR operation, OR means an OR operation, and ==means whether it is equal. It can be seen that NAND(M7-M2), NAND(M6-M1), and NAND(M5-M0) indicate that whether there is 0 in every 6 consecutive values in M7-M0, OR(M7-M2), OR(M6-M1), and OR(M5-M0) indicate whether there is 1 in every 6 consecutive values in M7-M0.

If there are consecutive same values in the first data stream, for example, an 8-bit first data stream is (1011 1111), the first data stream is defined as the first data stream that does not meet the preset standard, and the first data stream may be a data signal that will cause bit errors during channel transmission.

The data assignment unit 30 is configured to perform a logical operation on each data bit in the data stream to be assigned a value and assigning a value to each data bit in a second data stream. In this embodiment, a number of the data bits in the second data stream is greater than a number of the data bits in the first data stream. The number of the data bits in the second data stream is 9.

The advantage of the present disclosure is that by acquiring the first data stream that does not meet the preset standard and recording the first data stream as the data stream to be assigned, performing the arithmetic operation on the first data stream in the data stream to be assigned to generate the second data stream meeting the preset standard, and adding a third preset number of data bits to the data stream that meets the preset standard to obtain the second data stream, the data stream that meets the preset standard can be screened out, and only the data stream that does not meet the preset standard is encoded, which reduces data calculation complexity and improves data transmission efficiency.

As shown in FIG. 5, FIG. 5 is a schematic structural diagram of a storage medium provided in a fourth embodiment of the present disclosure. The storage medium 1000 comprises a non-volatile and/or volatile memory. The non-volatile memory may comprise a read only memory (ROM), a programmable ROM (PROM), an electrically programmable ROM (EPROM), an electrically erasable programmable ROM (EEPROM), or a flash memory. A volatile memory may comprise a random access memory (RAM) or an external cache memory. As an illustration and not a limitation, a RAM is available in many forms, such as a static RAM (SRAM), a dynamic RAM (DRAM), a synchronous DRAM (SDRAM), a double data rate SDRAM (DDRSDRAM), an enhanced SDRAM (ESDRAM), a synchronous chain Channel DRAM (SLDRAM), a memory bus (RAMBUS) direct RAM (RDRAM), a direct memory bus dynamic RAM (DRDRAM), and a memory bus dynamic RAM (RDRAM), etc.

Specific examples are used in this article to illustrate the principles and implementations of the present disclosure. The descriptions of the above embodiments are only used to help understand the present disclosure. At the same time, for those skilled in the art, according to the idea of the present disclosure, there will be changes in the specific implementation and the scope of the present disclosure. In summary, the content of this specification should not be construed as a limitation to the present disclosure.

What is claimed is:

1. A data encoding method, comprising:
    obtaining raw data, wherein the raw data comprises a plurality of first data streams;
    obtaining a first data stream that does not meet a preset standard and recording the first data stream as a data stream to be assigned a value, wherein the first data stream comprises a first preset number of data bits, each of the data bits is filled with a corresponding value, and the preset standard is that a number of consecutive data bits with a same value does not exceed a second preset number; and
    performing an arithmetic operation on the first data stream in the data stream to be assigned the value to generate a second data stream that meets the preset standard,
    wherein the first data stream comprises a zeroth data bit in the first data steam, a first data bit in the first data stream, a second data bit in the first data stream, a third data bit in the first data stream, a fourth data bit in the first data stream, a fifth data bit in the first data stream, a sixth data bit in the first data stream, and a seventh data bit in the first data stream, and
    wherein the second data stream comprises a zeroth data bit in the second data stream, a first data bit in the second data stream, a second data bit in the second data stream, a third data bit in the second data stream, a fourth data bit in the second data stream, a fifth data bit in the second data stream, a sixth data bit in the second data stream, a seventh data bit in the second data stream, and an eighth data bit in the second data stream.

2. The data encoding method of claim 1, wherein the arithmetic operation comprises:
    assigning a value of the third data bit in the first data stream to the zeroth data bit in the second data stream;
    assigning a value of the fifth data bit in the first data stream to the third data bit in the second data stream;
    assigning a value of the sixth data bit in the first data stream to the fourth data bit in the second data stream;
    assigning a value of the fourth data bit in the first data stream to the seventh data bit in the second data stream; and
    assigning a value of the seventh data bit in the first data stream to the eighth data bit in the second data stream.

3. The data encoding method of claim 2, wherein the arithmetic operation further comprises:
    when the second data bit in the first data stream is a first value and the first data bit in the first data stream is a second value, the first data bit in the second data stream is the second value;
    when the third data bit in the first data stream is the first value, the second data bit in the first data stream is the second value, and the first data bit in the first data stream is the second value, the first data bit in the second data stream is the second value;
    when the second data bit in the first data stream is the first value and the zeroth data bit in the first data stream is the first value, the first data bit in the second data stream is the second value;
    when the second data bit in the first data stream is the second value and the first data bit in the first data stream is the second value, the second data bit in the second data stream is the second value;
    when the third data bit in the first data stream is the first value, the second data bit in the first data stream is the second value, and the first data bit in the first data stream is the second value, the second data bit in the second data stream is the second value; and
    when the first data bit in the first data stream is the first value and the zeroth data bit in the first data stream is the second value, the second data bit in the second data stream is the second value.

4. The data encoding method of claim 3, wherein the arithmetic operation further comprises:
    when the fourth data bit in the first data stream is the first value, the second data bit in the first data stream is the first value, and the first data bit in the first data steam is the first value, the fifth data bit in the second data stream is the second value;
    when the second data bit in the first data stream is the second value and the zeroth data bit in the first data stream is the first value, the fifth data bit in the second data stream is the second value;
    when the first data bit in the first data stream is the second value and the zeroth data bit in the first data stream is the first value, the fifth data bit in the second data stream is the second value;
    when the fourth data bit in the first data stream is the first value, the second data bit in the first data stream is the first value, and the first data bit in the first data steam is the first value, the sixth data bit in the second data stream is the second value;
    when the second data bit in the first data stream is the second value and the zeroth data bit in the first data stream is the second value, the sixth data bit in the second data stream is the second value; and
    when the first data bit in the first data stream is the second value and the zeroth data bit in the first data stream is the second value, the sixth data bit in the second data stream is the second value.

5. The data encoding method of claim 1, wherein the data encoding method comprises steps of:
    obtaining the first data stream that meets the preset standard and recording the first data steam as a data stream to be filled; and
    adding a third preset number of data bits to the data stream to be filled to obtain the second data stream.

6. The data encoding method of claim 1, wherein a value of the first preset number is greater than a value of the second preset number.

7. The data encoding method of claim 1, wherein a number of data bits in the second data stream is greater than a number of data bits in the first data stream.

8. The data encoding method of claim 1, wherein a value of the second preset number is not greater than 5.

9. A data encoding device, comprising:
a data acquisition unit configured to obtain raw data, wherein the raw data comprises a plurality of first data streams;
an assignment data acquisition unit configured to obtain a first data stream that does not meet a preset standard and recording the first data stream as a data stream to be assigned, wherein the first data stream comprises a first preset number of data bits, each of the data bits is filled with a corresponding value, and the preset standard is that a number of consecutive data bits with a same value does not exceed a second preset number; and
a data assignment unit configured to perform an arithmetic operation on the first data stream in the data stream to be assigned to generate a second data stream that meets the preset standard.

10. The data encoding device of claim 9, wherein a value of the first preset number is greater than a value of the second preset number.

11. The data encoding device of claim 9, wherein a number of data bits in the second data stream is greater than a number of data bits in the first data stream.

12. The data encoding device of claim 9, wherein a value of the second preset number is not greater than 5.

13. A storage medium, wherein a plurality of instructions are stored in the storage medium, and the instructions are adapted to be loaded by a processor to execute an encoding method, and the encoding method comprises:
obtaining raw data, wherein the raw data comprises a plurality of first data streams;
obtaining a first data stream that does not meet a preset standard and recording the first data stream as a data stream to be assigned, wherein the first data stream comprises a first preset number of data bits, each of the data bits is filled with a corresponding value, and the preset standard is that a number of consecutive data bits with a same value does not exceed a second preset number; and
performing an arithmetic operation on the first data stream in the data stream to be assigned to generate a second data stream that meets the preset standard,
wherein the first data stream comprises a zeroth data bit in the first data steam, a first data bit in the first data stream, a second data bit in the first data stream, a third data bit in the first data stream, a fourth data bit in the first data stream, a fifth data bit in the first data stream, a sixth data bit in the first data stream, and a seventh data bit in the first data stream, and
wherein the second data stream comprises a zeroth data bit in the second data stream, a first data bit in the second data stream, a second data bit in the second data stream, a third data bit in the second data stream, a fourth data bit in the second data stream, a fifth data bit in the second data stream, a sixth data bit in the second data stream, a seventh data bit in the second data stream, and an eighth data bit in the second data stream.

14. The storage medium of claim 13, wherein the arithmetic operation comprises:
assigning a value of the third data bit in the first data stream to the zeroth data bit in the second data stream;
assigning a value of the fifth data bit in the first data stream to the third data bit in the second data stream;
assigning a value of the sixth data bit in the first data stream to the fourth data bit in the second data stream;
assigning a value of the fourth data bit in the first data stream to the seventh data bit in the second data stream; and
assigning a value of the seventh data bit in the first data stream to the eighth data bit in the second data stream.

15. The storage medium of claim 14, wherein the arithmetic operation further comprises:
when the second data bit in the first data stream is a first value and the first data bit in the first data stream is a second value, the first data bit in the second data stream is the second value;
when the third data bit in the first data stream is the first value, the second data bit in the first data stream is the second value, and the first data bit in the first data stream is the second value, the first data bit in the second data stream is the second value;
when the second data bit in the first data stream is the first value and the zeroth data bit in the first data stream is the first value, the first data bit in the second data stream is the second value;
when the second data bit in the first data stream is the second value and the first data bit in the first data stream is the second value, the second data bit in the second data stream is the second value;
when the third data bit in the first data stream is the first value, the second data bit in the first data stream is the second value, and the first data bit in the first data stream is the second value, the second data bit in the second data stream is the second value; and
when the first data bit in the first data stream is the first value and the zeroth data bit in the first data stream is the second value, the second data bit in the second data stream is the second value.

16. The storage medium of claim 15, wherein the arithmetic operation further comprises:
when the fourth data bit in the first data stream is the first value, the second data bit in the first data stream is the first value, and the first data bit in the first data steam is the first value, the fifth data bit in the second data stream is the second value;
when the second data bit in the first data stream is the second value and the zeroth data bit in the first data stream is the first value, the fifth data bit in the second data stream is the second value;
when the first data bit in the first data stream is the second value and the zeroth data bit in the first data stream is the first value, the fifth data bit in the second data stream is the second value;
when the fourth data bit in the first data stream is the first value, the second data bit in the first data stream is the first value, and the first data bit in the first data steam is the first value, the sixth data bit in the second data stream is the second value;
when the second data bit in the first data stream is the second value and the zeroth data bit in the first data stream is the second value, the sixth data bit in the second data stream is the second value; and
when the first data bit in the first data stream is the second value and the zeroth data bit in the first data stream is the second value, the sixth data bit in the second data stream is the second value.

17. The storage medium of claim 16, wherein the data encoding method comprises steps of:
obtaining the first data stream that meets the preset standard and recording the first data steam as a data stream to be filled; and adding a third preset number of data bits to the data stream to be filled to obtain the second data stream.

18. The storage medium of claim 13, wherein a value of the first preset number is greater than a value of the second preset number.

19. The storage medium of claim 13, wherein a number of data bits in the second data stream is greater than a number of data bits in the first data stream.

20. The storage medium of claim 13, wherein a value of the second preset number is not greater than 5.

* * * * *